(12) United States Patent
Yamadaya

(10) Patent No.: US 8,189,310 B2
(45) Date of Patent: May 29, 2012

(54) CMOS INTEGRATED CIRCUIT

(75) Inventor: Masayuki Yamadaya, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 317 days.

(21) Appl. No.: 12/558,658

(22) Filed: Sep. 14, 2009

(65) Prior Publication Data
US 2010/0118456 A1 May 13, 2010

(30) Foreign Application Priority Data

Sep. 12, 2008 (JP) .................................. 2008-234792

(51) Int. Cl.
*H02H 3/22* (2006.01)
(52) U.S. Cl. .......................................... 361/56; 361/111
(58) Field of Classification Search .................... 361/56, 361/111, 18
See application file for complete search history.

(56) References Cited

U.S. PATENT DOCUMENTS 5,212,616 A * 5/1993 Dhong et al. .................... 361/18
5,333,105 A * 7/1994 Fortune ...................... 363/56.11
6,731,488 B2 * 5/2004 Voldman ....................... 361/111

FOREIGN PATENT DOCUMENTS
JP 2006-318204 A 11/2006
* cited by examiner

*Primary Examiner* — Danny Nguyen
(74) *Attorney, Agent, or Firm* — Rossi, Kimms & McDowell LLP

(57) ABSTRACT

A CMOS IC according to the invention includes a discharging circuit for preventing electrostatic breakdown from occurring. The discharging circuit includes a discharging NMOSFET Qe, which couples a gate terminal node Vgp continuous to the gate of an outputting PDMOS transistor $Q_o$ and the gate of a discharging NMOSFET Qe via a capacitor Ce, and connects the drain of the discharging NMOSFET Qe to a gate terminal node Vgp continuous to the gate terminal of the outputting PDMOS transistor $Q_o$. The discharging circuit 300 also includes a pull-down resistor disposed between the gate of the discharging NMOSFET Qe and the ground for preventing the discharging NMOSFET Qe from operating in a steady state condition. The CMOS IC according to the invention makes the discharging NMOSFET Qe trigger to operate by the potential change at the node corresponding to the potential change of the power supply line, when a surge caused by static electricity and such is applied to the power supply line.

3 Claims, 2 Drawing Sheets

# CMOS INTEGRATED CIRCUIT

BACKGROUND

The present invention relates to a CMOS integrated circuit (hereinafter referred to as a "CMOS IC"). Specifically, the invention relates to a CMOS IC that protects devices in an integrated circuit from a surge of voltage caused by static electricity and such applied to a power supply line.

When a surge of voltage caused by static electricity and such is applied to a power supply (VCC) line, the surge voltage exceeds the breakdown voltage of the device, which constitutes a CMOS IC, e.g. a series regulator circuit manufactured by the CMOS process, and sometimes breaks down the device.

FIG. 2 is a circuit diagram showing a configuration of a conventional CMOS IC. In detail, a conventional CMOS integrated circuit (hereinafter referred to as "CMOS IC") 400 shown in FIG. 2 constitutes a series regulator circuit manufactured by the CMOS process. The conventional CMOS IC 400 feeds an output current to a load 418 via a P-channel double-diffused metal-oxide-semiconductor transistor $Q_o$ (410) for feeding an output (hereinafter referred to as "outputting PDMOS transistor $Q_o$ (410)"). The CMOS IC 400 is provided with a control system that controls output voltage (VREG) 4 at a certain value, even when a variation is caused in a power supply (VCC) 1 or the load 418.

The control system detects an output voltage (VREG) 4 applied to the load 418 as a divided voltage from a connection point 421 of a voltage divider circuit including dividing resistors $R_1$ (419) and $R_2$ (420) via node 417. The control system feeds the divided voltage detected to the gate of P-channel MOSFET (hereinafter referred to as "PMOSFET") 513 that constitutes a differential amplifying pair of differential input stage 510 in operational amplifier section 500. Reference voltage (VREF) 2 is fed to the gate of another PMOSFET 512 that constitutes the differential amplifying pair. Reference voltage (VREF) 2 and the divided voltage detected are compared with each other. When reference voltage (VREF) 2 is higher than the divided voltage, the control system increases the output current from outputting PDMOS transistor $Q_o$ (410) to raise output voltage (VREG) 4. When the divided voltage is higher than reference voltage (VREF) 2, the control system decreases the output current from outputting PDMOS transistor $Q_o$ (410) to lower output voltage (VREG) 4. The Patent Document 1 describes in detail a series regulator circuit including the control system as described above.

The differential input stage 510 in the operational amplifier section 500 is connected to the line of power supply (VCC) 1. The Differential input stage 510 includes constant current supply 511 that makes a constant current flow to the sources of PMOSFET's 512 and 513, a differential amplifying pair including PMOSFET's 512 and 513, and a current mirror circuit including two N-channel MOSFET's (hereinafter referred to as "NMOSFET's") 516 and 517 that make an equal current flow to PMOSFET's 512 and 513.

The operational amplifier section 500 includes an output stage 520 including resistor Rg (521) and NMOSFET Qn (524). The operational amplifier section 500 also includes a feedback circuit including feedback capacitor Cfb (532) for phase compensation and feedback resistor Rfb (531) for phase compensation, both connected between differential input stage 510 and output stage 520.

The connection point 514 of the drain of PMOSFET 513 working for the output port of the differential input stage 510 and the drain of NMOSFET 517 is connected via feedback capacitor Cfb (532) for phase compensation and feedback resistor Rfb (531) for phase compensation to the drain of NMOSFET Qn (524). The connection point 514 of the drain of PMOSFET 513 and the drain of NMOSFET 517 is connected via a gate terminal node Vgp (522) to the gate of the outputting PDMOS transistor $Q_o$ (410). The connection point 515 of the drain of PMOSFET 513 working for the output port of differential input stage 510 and the drain of NMOSFET 517 is connected to the gate of NMOSFET Qn (524). The drain of NMOSFET Qn (524) is connected to the line of power supply (VCC) 1 via resistor Rg (521) and to the gate of outputting PDMOS transistor $Q_o$ (410) via gate terminal node Vgp (522). Zener diode 422 is disposed for protecting the gate of outputting PDMOS transistor $Q_o$ (410) from a high voltage.

In order to protect devices in the integrated circuit from a surge caused by static electricity and such applied to the power supply line, conventional CMOS IC 400 shown in FIG. 2 operates in the following manner, namely, outputting PDMOS transistor $Q_o$ (410) and NMOSFET Qn (524) that controls the output from outputting PDMOS transistor $Q_o$ (410) conduct the surge applied to the line of power supply (VCC) 1 through themselves to prevent the devices constituting the integrated circuit from being be broken down.

Now the protection operation described above will be investigated below. When a surge caused by static electricity and such is applied to the line of power supply (VCC) 1, the voltage on the line of power supply (VCC) 1 rises rapidly (a surge voltage is caused). In this case, conventional CMOS IC 400 shown in FIG. 2 discharges the surge superposed on the line of power supply (VCC) 1 through the mechanism described below.

First, the surge voltage is applied directly to the source of outputting PDMOS transistor $Q_o$ (410), forming the source potential of outputting PDMOS transistor $Q_o$ (410). In addition to this, the divided voltage obtained by dividing the surge voltage with capacitance Cgs (404) between the gate and source of outputting PDMOS transistor $Q_o$ (410), capacitance Cgd (402) between the gate and drain of outputting PDMOS transistor $Q_o$ (410) and capacitance Cg (406) is applied to the gate of outputting PDMOS transistor $Q_o$ (410), forming the gate potential of outputting PDMOS transistor $Q_o$ (410). As a result, outputting PDMOS transistor $Q_o$ (410) is brought into the ON-state thereof. In other words, the source potential of outputting PDMOS transistor $Q_o$ (410) rises rapidly as soon as the voltage on the line of (VCC) 1 rises rapidly. As described above, the division of the surge voltage with capacitors Cgs (404), Cgd (402) and Cg (406) forms the gate potential of outputting PDMOS transistor $Q_o$ (410). Although the gate potential of outputting PDMOS transistor $Q_o$ (410) changes corresponding to the voltage change on the line of (VCC) 1, the gate potential of outputting PDMOS transistor $Q_o$ (410) does not rise so high as the source potential thereof. Due to the potential scheme described above, the voltage between the source and gate of outputting PDMOS transistor $Q_o$ (410) rises, bringing outputting PDMOS transistor $Q_o$ (410) into the ON-state thereof. Outputting PDMOS transistor $Q_o$ (410) in the ON-state thereof makes a current flow to load 418. Here, it is assumed that capacitance Cgs (404) includes the gate capacitance of outputting PDMOS transistor $Q_o$ (410). Capacitance Cg (406) represents the floating capacitance around NMOSFET Qn (524).

Second, the gate voltage of NMOSFET Qn (524) is raised by the voltage rising rapidly on the line of power supply (VCC) 1 via resistor Rg (521), feedback capacitor Cfb (532) for phase compensation and feedback resistor Rfb (531) for phase compensation, bringing NMOSFET Qn (524) into the ON-state thereof. NMOSFET Qn (524) in the ON-state thereof makes a current flow from the line of power supply (VCC) 1 to ground (GND) 3 and lowers the voltage of gate terminal node Vgp (522). As the voltage of gate terminal node Vgp (522) is lowered, outputting PDMOS transistor $Q_o$ (410) is brought further deep into the ON-state thereof. [Patent Document 1] Japanese Unexamined Patent Application Publication No. 2006-318204

The conventional CMOS IC 400 increases the output current therefrom to prevent the circuit devices from being broken down by the surge superposed on the power supply line. However, for increasing the output current, it is necessary to enlarge the size of outputting PDMOS transistor $Q_o$ (410). As the size of outputting PDMOS transistor $Q_o$ (410) is enlarged, capacitance Cgs (404) between the gate and drain of outputting PDMOS transistor $Q_o$ (410) becomes higher. For stabilizing the feedback system, it is necessary to enlarge feedback resistor Rfb (531) and feedback capacitor Cfb (532). As capacitance Cgs (404) between the gate and drain of outputting PDMOS transistor $Q_o$ (410) becomes higher, it is easier for the potential at the gate terminal node Vgp (522) to follow the voltage on the line of power supply (VCC) 1 and it is harder for outputting PDMOS transistor $Q_o$ (410) to be ON.

For stabilizing the feedback system, the product of feedback resistance Rfb (531) and feedback capacitance Cfb (532) is increased generally. Since the rise of the capacitor capacitance in an integrated circuit adversely affects the area of the integrated circuit greatly, it is practical to enlarge feedback resistor Rfb (531). However, as the feedback resistor Rfb (531) becomes larger, the impedance to the gate terminal of NMOSFET Qn (524) becomes higher, making it hard to transmit the variations caused in the power supply (VCC) 1 and at gate terminal node Vgp (522) to the gate of NMOSFET Qn (524). As a result, it is hard for NMOSFET Qn (524) to be ON. Therefore, a too-high surge voltage is applied to NMOSFET Qn (524), breaking down NMOSFET Qn (524) sometimes.

In view of the foregoing, it would be desirable to provide a CMOS integrated circuit (CMOS IC) that makes a switch to be triggered to operate, when a surge caused by static electricity and such is applied to a power supply line, by the potential change at a node corresponding to the potential change of the power supply line for preventing the circuit device in the IC from being broken down.

SUMMARY OF THE INVENTION

The CMOS IC according to the invention is configured to operate, only when a surge caused by static electricity and such is applied to the power supply line, for preventing the devices in the integrated circuit from being broken down without affecting adversely the static properties of the CMOS IC.

In detail, the CMOS IC according to the invention includes a discharging N-channel MOSFET for discharging, couples the gate terminal node of an outputting PDMOS transistor for feeding an output with the gate of discharging N-channel MOSFET a via a capacitance, and connects the drain of discharging N-channel MOSFET and the gate terminal node of the outputting PDMOS transistor directly. By virtue of the configuration described above, the discharging N-channel MOSFET is brought into the ON-state thereof to conduct a discharging operation, only when a surge caused by static electricity and such is applied to the power supply line. The CMOS IC according to the invention further includes a pull-down resistor connected to the gate of the discharging N-channel MOSFET so as not to make the discharging N-channel MOSFET operate in a steady state.

The CMOS IC according to the invention facilitates forming a path, through which the surge caused on the power supply line by static electricity and such a cause is discharged, without limiting the output current capacity of the outputting PDMOS transistor nor affecting adversely the stability of the CMOS IC.

Other features, objects, advantages and embodiments of the invention will become apparent from the following detailed description of the preferred embodiments of the invention.

BRIEF DESCRIPTION OF THE DRAWINGS

The invention will be described with reference to certain preferred embodiments thereof and the accompanying figures, wherein.

DETAILED DESCRIPTION OF THE PREFERRED EMBODIMENTS

Figure 1:
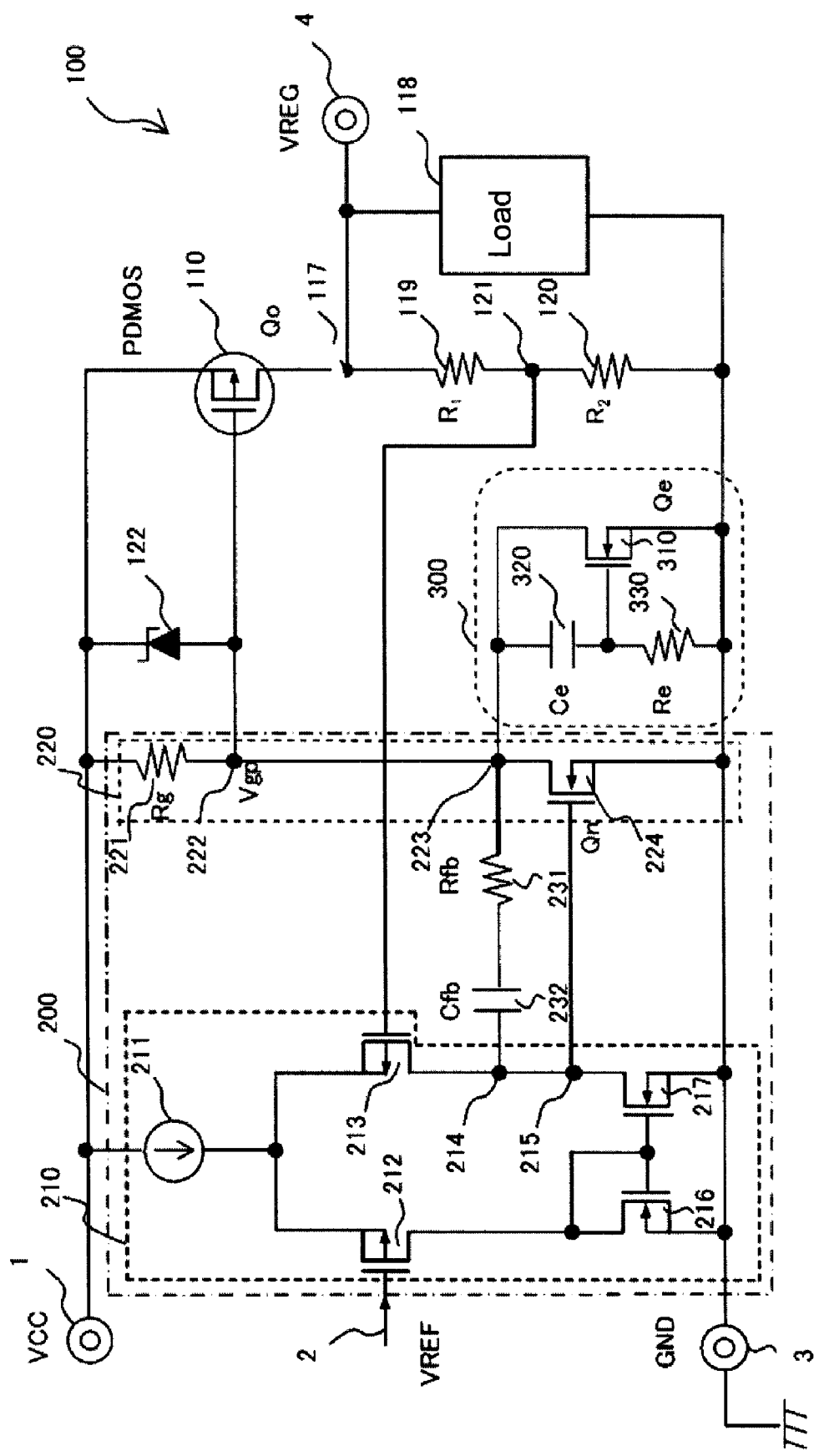
FIG. 1 is a circuit diagram showing the configuration of a CMOS IC according to an embodiment of the invention.
Figure 2:
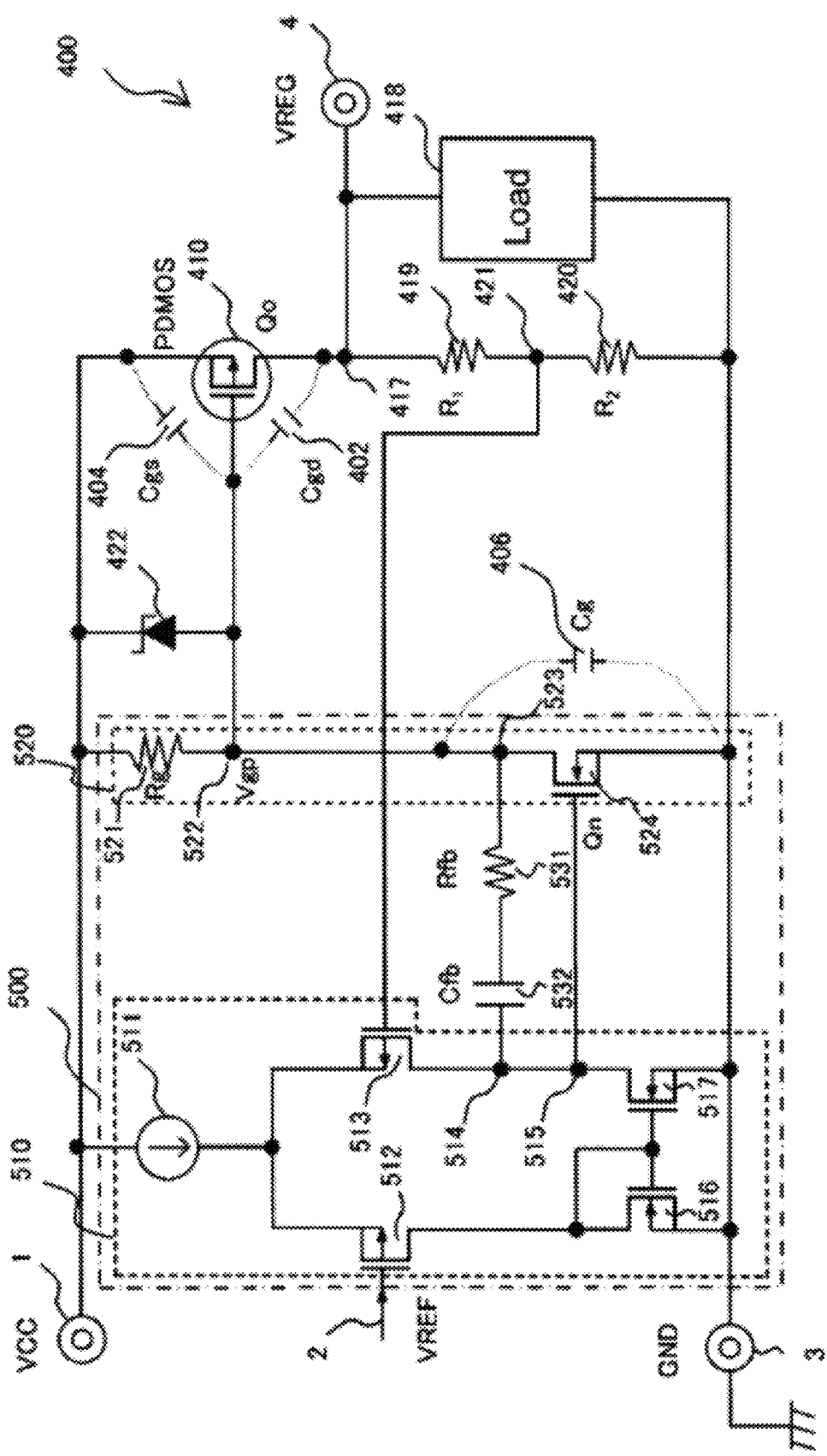
FIG. 2 is a circuit diagram showing the configuration of a conventional CMOS IC.

FIG. 1 is a circuit diagram showing the configuration of a CMOS IC according to an embodiment of the invention. Referring to FIG. 1, a CMOS IC 100 according to the invention constitutes a series regulator circuit manufactured by the CMOS process. The CMOS IC 100 feeds an output current to a load 118 via P-channel double-diffused metal-oxide-semiconductor transistor $Q_o$ (110) for feeding an output (hereinafter referred to as "outputting PDMOS transistor $Q_o$ (110)"). The CMOS IC 100 is provided with a control system that controls an output voltage (VREG) 4 at a certain value, even when a variation is caused in a power supply (VCC) 1 or a load 118.

The control system detects an output voltage (VREG) 4 applied to the load 118 as a divided voltage from a connection point 121 of a voltage divider circuit including dividing resistors $R_1$ (119) and $R_2$ (120) via node 117. The control system inputs the divided voltage detected to the gate of P-channel MOSFET (hereinafter referred to as "PMOSFET") 213 that constitutes a differential amplifying pair of a differential input stage 210 in an operational amplifier section 200. A reference voltage (VREF) 2 is fed to the gate of another PMOSFET 212 that constitutes the differential amplifying pair. The reference voltage (VREF) 2 and the divided voltage are compared with each other. When reference voltage (VREF) 2 is higher than the divided voltage, the control system increases the output current from the outputting PDMOS transistor $Q_o$ (110) to raise the output voltage (VREG) 4. When the divided voltage is higher than the reference voltage (VREF) 2, the control system decreases the output current from the outputting PDMOS transistor $Q_o$ (110) to lower the output voltage (VREG) 4.

The operational amplifier section 200 is connected to the line of power supply (VCC) 1. The differential input stage 210 includes a constant current supply 211, connected to the line of power supply (VCC) 1, that makes a constant current flow to the sources of PMOSFET's 212 and 213, a differential amplifying pair including PMOSFET's 212 and 213, and a current mirror circuit including two N-channel MOSFET's (hereinafter referred to as "NMOSFET's") 216 and 217 that make an equal current flow to PMOSFET's 212 and 213.

The operational amplifier section 200 includes an output stage 220 including a resistor Rg (221) and an NMOSFET Qn (224). The operational amplifier section 200 includes also a feedback circuit including a feedback capacitor Cfb (232) for phase compensation and a feedback resistor Rfb (231) for phase compensation, both connected between the differential input stage 210 and the output stage 220.

The connection point 214 of the drain of PMOSFET 213 working for the output port of differential input stage 210 and the drain of NMOSFET 217 is connected via feedback capacitor Cfb (232) for phase compensation and feedback resistor Rfb (231) for phase compensation to the drain of the NMOSFET Qn (224). The connection point 214 of the drain of PMOSFET 213 and the drain of NMOSFET 217 is connected via gate terminal node Vgp (222) also to the gate of outputting PDMOS transistor $Q_o$ (110). A connection point 215 of the drain of the PMOSFET 213 working for the output port of the differential input stage 210 and the drain of NMOSFET 217 is connected to the gate of the NMOSFET Qn (224). The drain of the NMOSFET Qn (224) is connected to the line of the power supply (VCC) 1 via the resistor Rg (221) and to the gate of the outputting PDMOS transistor $Q_o$ (110) via a gate terminal node Vgp (222). A Zener diode 122 is disposed for protecting the gate of the outputting PDMOS transistor $Q_o$ (110) from a high voltage.

In order to prevent the devices in the integrated circuit from being broken down by a surge caused by static electricity and such applied to the power supply line, the CMOS IC 100 shown in FIG. 1 includes an electrostatic-breakdown-prevention discharging circuit (hereinafter referred to simply as "discharging circuit") 300 for preventing electrostatic breakdown. The discharging circuit 300 conducts discharging, only when a surge caused by static electricity and such is applied to the line of power supply (VCC) 1, without affecting the static properties of the CMOS IC.

The discharging circuit 300 includes N-channel MOSFET for discharging (hereinafter referred to as "discharging NMOSFET") Qe (310). Gate terminal node Vgp (222) continuous to the gate of outputting PDMOS transistor $Q_o$ (110) and the gate of discharging NMOSFET Qe (310) are coupled with each other via capacitor Ce (320). Alternatively, the power supply (VCC) 1 and the gate of discharging NMOSFET Qe (310) may be coupled via a capacitor Ce (320) with no problem. Moreover, the drain of discharging NMOSFET Qe (310) is connected, via connection point 223 connected to the drain of NMOSFET Qn (224) that controls outputting PDMOS transistor $Q_o$ (110), to the gate terminal node Vgp (222) continuous to the gate of outputting PDMOS transistor $Q_o$ (110).

Discharging circuit 300 includes pull-down resistor Re (330) disposed between the gate of discharging NMOSFET Qe (310) and ground (GND) for making discharging NMOSFET Qe (310) not to work during steady state operation.

Now the operation of the CMOS IC according to the invention will be described below. When the voltage of the line of the power supply (VCC) 1 is raised rapidly by the surge caused by static electricity and such (when a surge voltage is caused), the voltage at gate terminal node Vgp (222) is raised rapidly via the not-shown capacitance between the gate and source of the outputting PDMOS transistor $Q_o$ (110). In the same manner as in the conventional CMOS IC, the divided voltage obtained by dividing the surge voltage on the line of power supply (VCC) 1 with a plurality of capacitors is applied to the gate terminal node Vgp (222). Therefore, the gate terminal node Vgp (222) works as a node, the potential thereof changes corresponding to the voltage change of the line of the power supply (VCC) 1. The voltage change at the gate terminal node Vgp (222) is transmitted to the gate terminal of the discharging NMOSFET Qe (310) in an alternating current manner by the capacitor Ce (320) disposed in the discharging circuit 300. If the changing voltage at the gate terminal of the discharging NMOSFET Qe (310) finally exceeds the threshold voltage of the discharging NMOSFET Qe (310) to the higher side, the discharging NMOSFET Qe (310) will be brought into the ON-state thereof.

As the discharging NMOSFET Qe (310) in the discharging circuit 300 is brought into the ON-state thereof, the discharging NMOSFET Qe (310) makes a current flow to ground (GND) 3 from the power supply (VCC) 1 via the resistor Rg (221). Therefore, the voltage at the gate terminal node Vgp (222) connected directly to the gate terminal of the outputting PDMOS transistor $Q_o$ (110) falls. As the voltage at the gate terminal node Vgp (222) falls, the gate voltage of the outputting PDMOS transistor $Q_o$ (110) falls. Since the gate voltage of the outputting PDMOS transistor $Q_o$ (110) falls, the outputting PDMOS transistor $Q_o$ (110) is brought into the ON-state thereof. Therefore, the energy fed from the power supply (VCC) 1 by a surge is discharged by the discharging NMOSFET Qe (310) and the outputting PDMOS transistor $Q_o$ (110), both in the respective ON-states thereof. Thus, breakdown of the circuit devices is prevented from being causing.

On the other hand, a certain voltage is applied to the gate of the discharging NMOSFET Qe (310) via the pull-down resistor Re (330) so that the discharging NMOSFET Qe (310) may not be brought into the ON-state thereof during steady state operations.

As described above, the CMOS IC according to the invention facilitates forming a path, through which the surge caused on the power supply line by static electricity and such cause is discharged, without limiting the output current capacity of the outputting PDMOS transistor nor affecting adversely the stability of the CMOS IC. For preventing the discharging circuit 300 from affecting adversely the normal mode of operations of the CMOS IC, it is necessary to design so that the delay caused by capacitor Ce (320) and pull-down resistor Re (330) used in the discharging circuit 300 may have a sufficient margin for the frequency characteristics of the CMOS IC (that is, so that the delay may be short).

The invention has been described with reference to certain preferred embodiments thereof. It will be understood, however, that variations and modifications are possible within the scope of the appended claims.

This application is based on, and claims priority to, Japanese Patent Application No. 2008-234792, filed on 12 Sep. 2008. The disclosure of the priority application, in its entirety, including drawings, claims and the specification thereof, is incorporated herein by reference.

What is claimed is:

1. An apparatus comprising:
   a power supply line;
   a discharging switch, wherein the discharging switch is triggered to operate by a potential change of the power supply line or by a potential change at a node corresponding to the potential change of the power supply line, the discharging switch comprising an N-channel MOSFET comprising a gate terminal and a drain terminal, wherein the gate terminal of the N-channel MOSFET is coupled with the power supply line or with the node, the potential change thereat corresponds to the potential change of the power supply line, via a capacitor, and wherein the drain terminal of the N-channel MOSFET is connected to the node, the potential change thereat corresponds to the potential change of the power supply line; and
   a CMOS integrated circuit that makes the discharging switch operate when a surge is applied to the power supply line in order to protect devices in the CMOS integrated circuit from a voltage caused by the surge, said CMOS integrated circuit comprising an operational amplifier comprising an output terminal, and an outputting transistor comprising a gate terminal connected to the output terminal of the operational amplifier; wherein the operational amplifier further comprises a differential amplifying stage, an output stage, and a feedback circuit comprising a feedback resistor and a feedback capacitor connected in series to each other; wherein the feedback circuit is connected between an output terminal of the output stage working for the output terminal of the operational amplifier and an output terminal of the differential amplifying stage; and wherein the drain terminal of the N-channel MOSFET constituting the discharging switch is connected to the output terminal of the operational amplifier.

2. The apparatus according to claim 1, wherein the CMOS integrated circuit further comprises a pull-down resistor between the gate terminal of the N-channel MOSFET and a ground.

3. The apparatus according to claim 1, wherein the CMOS integrated circuit comprises a series regulator circuit.

* * * * *